（12）United States Patent
Dhori et al.

(10) Patent No.: US 12,237,007 B2
(45) Date of Patent: Feb. 25, 2025

(54) SELECTIVE BIT LINE CLAMPING CONTROL FOR AN IN-MEMORY COMPUTE OPERATION WHERE SIMULTANEOUS ACCESS IS MADE TO PLURAL ROWS OF A STATIC RANDOM ACCESS MEMORY (SRAM)

(71) Applicant: STMicroelectronics International N.V., Geneva (CH)

(72) Inventors: Kedar Janardan Dhori, Ghaziabad (IN); Harsh Rawat, Haryana (IN); Promod Kumar, Greater Noida (IN); Nitin Chawla, Noida (IN); Manuj Ayodhyawasi, Noida (IN)

(73) Assignee: STMicroelectronics International N.V., Geneva (CH)

( * ) Notice: Subject to any disclaimer, the term of this patent is extended or adjusted under 35 U.S.C. 154(b) by 128 days.

(21) Appl. No.: 17/852,567

(22) Filed: Jun. 29, 2022

(65) Prior Publication Data

US 2023/0012303 A1    Jan. 12, 2023

Related U.S. Application Data

(60) Provisional application No. 63/219,987, filed on Jul. 9, 2021.

(51) Int. Cl.
  *G11C 11/418*   (2006.01)
  *G11C 11/412*   (2006.01)
  *G11C 11/419*   (2006.01)

(52) U.S. Cl.
  CPC .......... *G11C 11/418* (2013.01); *G11C 11/412* (2013.01); *G11C 11/419* (2013.01)

(58) Field of Classification Search
  CPC .... G11C 11/418; G11C 11/412; G11C 11/419
  (Continued)

(56) References Cited

U.S. PATENT DOCUMENTS 6,198,671 B1    3/2001   Aoyama et al.
6,282,137 B1 *  8/2001   Lee .................. G11C 11/419
                                                365/207

(Continued)

FOREIGN PATENT DOCUMENTS

CN    110503995 A     11/2019
EP      0461430 A1    12/1991
(Continued)

OTHER PUBLICATIONS

Lin, Zhiting, et al.: "Cascade Current Mirror to Improve Linearity and Consistency in SRAM In-Memory Computing," IEEE Journal of Solid-State Circuits, vol. 56, No. 8, Aug. 2021, 13 pgs.

(Continued)

*Primary Examiner* — Alexander Sofocleous
*Assistant Examiner* — Tracy Hampton
(74) *Attorney, Agent, or Firm* — Crowe & Dunlevy LLC

(57) ABSTRACT

A circuit includes a memory array with SRAM cells connected in rows by word lines and in columns by bit lines. A row controller circuit simultaneously actuates, through a word line driver circuit for each row, word lines in parallel for an in-memory compute operation. A column processing circuit processes analog voltages developed on the bit lines in response to the simultaneous actuation to generate a decision output for the in-memory compute operation. A bit line clamping circuit includes a sensing circuit that compares the analog voltages on a given pair of bit lines to a threshold voltage. A voltage clamp circuit is actuated in response to the comparison to preclude the analog voltages on the given pair of bit lines from decreasing below a clamping voltage level.

39 Claims, 7 Drawing Sheets

(58) Field of Classification Search
USPC .................................................. 365/230.03
See application file for complete search history.

(56) References Cited

U.S. PATENT DOCUMENTS

| | | | |
|---|---|---|---|
| 6,529,400 | B1 | 3/2003 | Bhavnagarwala et al. |
| 6,785,161 | B2 | 8/2004 | Pekny |
| 7,120,061 | B2 | 10/2006 | Daga |
| 7,173,837 | B1 | 2/2007 | Bettman et al. |
| 7,227,769 | B2 | 6/2007 | Fukushi et al. |
| 7,289,354 | B2 | 10/2007 | Houston |
| 7,342,845 | B2 | 3/2008 | Somasekhar et al. |
| 7,502,247 | B2 | 3/2009 | Houston |
| 7,508,697 | B1 | 3/2009 | Mukhopadhyay et al. |
| 7,525,834 | B2 | 4/2009 | Sohn |
| 7,564,725 | B2 | 7/2009 | Houston |
| 7,570,527 | B2 | 8/2009 | Houston |
| 7,742,326 | B2 | 6/2010 | Houston |
| 7,760,575 | B2 | 7/2010 | Tooher et al. |
| 7,773,407 | B2 | 8/2010 | Huang et al. |
| 7,813,163 | B2 | 10/2010 | Pille et al. |
| 8,004,907 | B2 | 8/2011 | Russell et al. |
| 8,064,241 | B2 | 11/2011 | Morita et al. |
| 8,134,874 | B2 | 3/2012 | Shiu et al. |
| 8,213,257 | B2 | 7/2012 | Chuang et al. |
| 8,441,829 | B2 | 5/2013 | Huang et al. |
| 8,451,652 | B2 | 5/2013 | Seikh et al. |
| 8,559,248 | B2 | 10/2013 | Dally et al. |
| 8,947,970 | B2 | 2/2015 | Pelley et al. |
| 8,966,329 | B2 | 2/2015 | Clark et al. |
| 8,971,146 | B2 | 3/2015 | Sharpe-Geisler et al. |
| 9,001,579 | B2 | 4/2015 | Song et al. |
| 9,013,949 | B2 | 4/2015 | Schreiber et al. |
| 9,087,566 | B2 | 7/2015 | Song et al. |
| 9,142,284 | B2 | 9/2015 | Lee et al. |
| 9,147,451 | B2 | 9/2015 | Chong et al. |
| 9,263,121 | B2 | 2/2016 | Karl et al. |
| 9,286,952 | B2 | 3/2016 | McLaury |
| 9,336,865 | B1 | 5/2016 | Chu et al. |
| 9,455,023 | B1 | 9/2016 | Xu et al. |
| 9,799,393 | B1 | 10/2017 | Ramamurthy et al. |
| 9,831,852 | B2 | 11/2017 | Boakye et al. |
| 9,928,898 | B2 | 3/2018 | Sahu et al. |
| 9,953,699 | B2 | 4/2018 | Ichihashi |
| 9,953,986 | B2 | 4/2018 | Wang |
| 9,997,236 | B1 | 6/2018 | Pathak |
| 10,319,434 | B2 | 6/2019 | Jung et al. |
| 10,403,629 | B2 | 9/2019 | Mann et al. |
| 10,541,013 | B1 | 1/2020 | Schreiber et al. |
| 10,559,573 | B2 | 2/2020 | Wang et al. |
| 10,642,922 | B2 | 5/2020 | Knag et al. |
| 10,650,909 | B2 | 5/2020 | Chen et al. |
| 10,679,694 | B2 | 6/2020 | Kumar et al. |
| 10,685,703 | B2 | 6/2020 | Singh et al. |
| 10,748,911 | B2 | 8/2020 | Singh et al. |
| 10,796,732 | B2 | 10/2020 | Yoshihara et al. |
| 10,811,088 | B2 | 10/2020 | Raj et al. |
| 11,048,434 | B2 | 6/2021 | Kumar et al. |
| 2002/0105825 | A1 | 8/2002 | Marshall et al. |
| 2006/0044018 | A1 | 3/2006 | Chang |
| 2008/0037358 | A1 | 2/2008 | Yabuuchi et al. |
| 2008/0144365 | A1 | 6/2008 | Yamaoka et al. |
| 2009/0046519 | A1 | 2/2009 | Wang et al. |
| 2011/0261633 | A1 | 10/2011 | Chandra et al. |
| 2014/0185364 | A1 | 7/2014 | Iyer et al. |
| 2014/0204657 | A1 | 7/2014 | Dally |
| 2015/0179232 | A1 | 6/2015 | Felix et al. |
| 2016/0232951 | A1 | 8/2016 | Shanbhag et al. |
| 2018/0012648 | A1 | 1/2018 | Ichihashi |
| 2019/0042160 | A1 | 2/2019 | Kumar et al. |
| 2019/0042199 | A1 | 2/2019 | Sumbul et al. |
| 2019/0198093 | A1* | 6/2019 | Khellah ............... G11C 7/12 |
| 2020/0075090 | A1 | 3/2020 | Kumar et al. |
| 2020/0082876 | A1 | 3/2020 | Singh et al. |
| 2021/0035614 | A1 | 2/2021 | Schreiber |

FOREIGN PATENT DOCUMENTS

| | | |
|---|---|---|
| EP | 3437098 B1 | 7/2019 |
| KR | 1020200091697 A | 7/2020 |
| WO | 0051131 A1 | 8/2000 |

OTHER PUBLICATIONS

Zhang, Jintao, et al.: "In-Memory Computation of a Machine-Learning Classifier in a Standard 6T SRAM Array," IEEE Journal of Solid-State Circuits, vol. 52, No. 4, Apr. 2017, 10 pgs.

Definition of "Buffer Amplifier," Wikipedia, 2021, 6 pgs.

Chang, Chip-Hong, et al.: "Sizing of SRAM Cell with Voltage Biasing Techniques for Reliability Enhancement of Memory and PUF Functions," Journal of Low Power Electronics and Applications, 2016, 6, 16; doi: 10.3390/jlpea6030016, 17 pgs.

Agrawal, Amogh, et al: X-SRAM: Enabling In-Memory Boolean Computations in CMOS Static Random Access Memories, IEEE Transactions on Circuits and Systems-I: Regular Papers, vol. 65, No. 12, Dec. 2018.

Biswas, Avishek, et al: CONF-SRAM: An Energy-Efficient SRAM With In-Memory Dot-Product Computation for Low-Power Convolution for Low-Power Convolutional Neural Networks, IEEE Journal of Solid-State Circuits, vol. 54, No. 1, Jan. 2019.

Biswas, Avishek: "Energy-Efficient Smart Embedded Memory Design for IoT and AI," Massachusetts Institute of Technology, Jun. 2018.

Dong, Qing, et al: A 351TOPS/W and 372.4GOPS Compute-in-Memory SRAM Macro in 6nm FinFET CMOS for Machine-Learning Applications, ISSCC 2020, Session 15, SRAM & Compute-In-Memory, 15.3.

H. Jia et al., 15.1 A Programmable Neural-Network Inference Accelerator Based on Scalable In-Memory Computing, 2021 IEEE International Solid-State Circuits Conference (ISSCC), 2021, pp. 236-238, doi: 10.1109/SSCC42613.2021.9365788.

H. Jia et al., Scalable and Programmable Neural Network Inference Accelerator Based on In-Memory Computing, in IEEE Journal of Solid-State Circuits, vol. 57, No. 1, pp. 198-211, Jan. 2022, doi: 10.1109/JSSC.2021.3119018.

J.-W. Su et al., 16.3 A 28nm 384kb 6T-SRAM Computation-in-Memory Macro with 8b Precision for AI Edge Chips, 2021 IEEE International Solid- State Circuits Conference (ISSCC), 2021, pp. 250-252, doi: 10.1109/ISSCC42613.2021.9365984.

J. Lee, H. Valavi, Y. Tang and N. Verma, Fully Row/Column-Parallel In-memory Computing SRAM Macro employing Capacitor-based Mixed-signal Computation with 5-b Inputs, 2021 Symposium on VLSI Circuits, 2021, pp. 1-2, doi: 10.23919/VLSICircuits52068.2021.9492444.

Jia, Hongyang, et al: A Microprocessor Implemented in 65nm CMOS with Configurable and Bit-scalable Accelerator for Programmable In-memory Computing, IEEE Journal of Solid-State Circuits, vol. 55, No. 9, pp. 2609-2621, Sep. 2020.

Jia, Hongyang, et al: A Programmable Heterogeneous Microprocessor Based on Bit-Scalable In-Memory Computing, IEEE Journal of Solid-State Circuits, vol. 55, No. 9, Sep. 2020.

Jiang, Zhewei, et al: C3SRAM: An In-Memory-Computing SRAM Macro Based on Robust Capacitive Coupling Computing Mechanism, IEEE Journal of Solid-State Circuits, vol. 55, No. 7, Jul. 2020.

Kang, Mingu, et al: A Multi-Functional In-Memory Inference Processor Using a Standard 6T SRAM Array, IEEE Journal of Solid-State Circuits, vol. 53, No. 2, Feb. 2018.

Kim, Jinseok, et al: Area-Efficient and Variation-Tolerant In-Memory BNN Computing using 6T SRAM Array, 2019 Symposium on VLSI Circuits Digest of Technical Papers.

Si, Xin, et al: A 28nm 64Kb 6T SRAM Computing-in-Memory Macro with 8b MAC Operation for AI Edge Chips, ISSCC 2020, Session 15, SRAM & Compute-In-Memorya, 15.5.

Si, Xin, et al: A Twin-8T SRAM Computation-In-Memory Macro for Multipe-Bit CNN-Based Machine Learning, ISSCC 2019, Session 24, SRAM & Computation-In-Memory, 24.5.

Singh, Jawar, et al: "A 2-Port 6T SRAM Bitcell Design with Multi-Port Capabilities at Reduced Area Overhead," 2010 IEEE.

(56) References Cited

OTHER PUBLICATIONS

Su, Jian-Wei, et al: A 28nm 64Kb Inference-Taining Two-Way Transpose Multibit 6T SRAM Compute-in-Memory Macro for AI Edge Chips, ISSCC 2020, Session 15, SRAM & Compute-In-Memory, 15.2.

V. K. Rajanna, S. Taneja and M. Alioto, SRAM with In-Memory Inference and 90% Bitline Activity Reduction for Always-On Sensing with 109 TOPS/mm2 and 749-1,459 TOPS/W in 28nm, ESSDERC 2021—IEEE 51st European Solid-State Device Research Conference (ESSDERC), 2021, pp. 127-130, doi: 10.1109/ESSDERC53440.2021.9631782.

Valavi, Hossein, et al: A 64-Tile 2.4-Mb In-Memory-Computing CNN Accelerator Employing Charge-Domain Compute, IEEE Journal of Solid-State Circuits, vol. 54, No. 6, Jun. 2019.

Y.-D. Chih et al., 16.4 An 89TOPS/W and 16.3TOPS/mm2 All-Digital SRAM-Based Full-Precision Compute-In Memory Macro in 22nm for Machine-Learning Edge Applications, 2021 IEEE International Solid-State Circuits Conference (ISSCC), 2021, pp. 252-254, doi: 10.1109/ISSCC42613.2021.9365766.

Yin, Shihui, et al: XNOR-SRAM: In-Memory Computing SRAM Macro for Binary/Ternary Deep Neural Networks, IEEE Journal of So.id-State Circuits, vol. 55, No. 6, Jun. 2020.

Z. Chen, X. Chen and J. Gu, 15.3 A 65nm 3T Dynamic Analog RAM-Based Computing-in-Memory Macro and CNN Accelerator with Retention Enhancement, Adaptive Analog Sparsity and 44TOPS/W System Energy Efficiency, 2021 IEEE International Solid-State Circuits Conference (ISSCC), 2021, pp. 240-242, doi: 10.1109/ISSCC42613.2021.9366045.

Zhang, Jintao, et al: In-Memory Computation of a Machine-Learning Classifier in a Standard 6T SRAM Array, IEEE Journal of Solid-State Circuits, vol. 52, No. 4, Apr. 2017.

Kushwah, C.B., et al: "Single-Ended Boost-Less (SE-BL) 7T Process Tolerant SRAM Design in Sub-threshold Regime for Ultra-Low-Power Applications," Springer Link, Jun. 3, 2015.

Lorenzo, Rohit, et al: "A novel 9T SRAM architecture for low leakage and high performance," Analog Integrated Circuits and Signal Processing, 92, 315-325 (2017).

Luo, Shien-Chun, et al: "A Subthreshold SRAM Cell with Autonomous Bitline-Voltage Clamping," 2010 IEEE.

\* cited by examiner

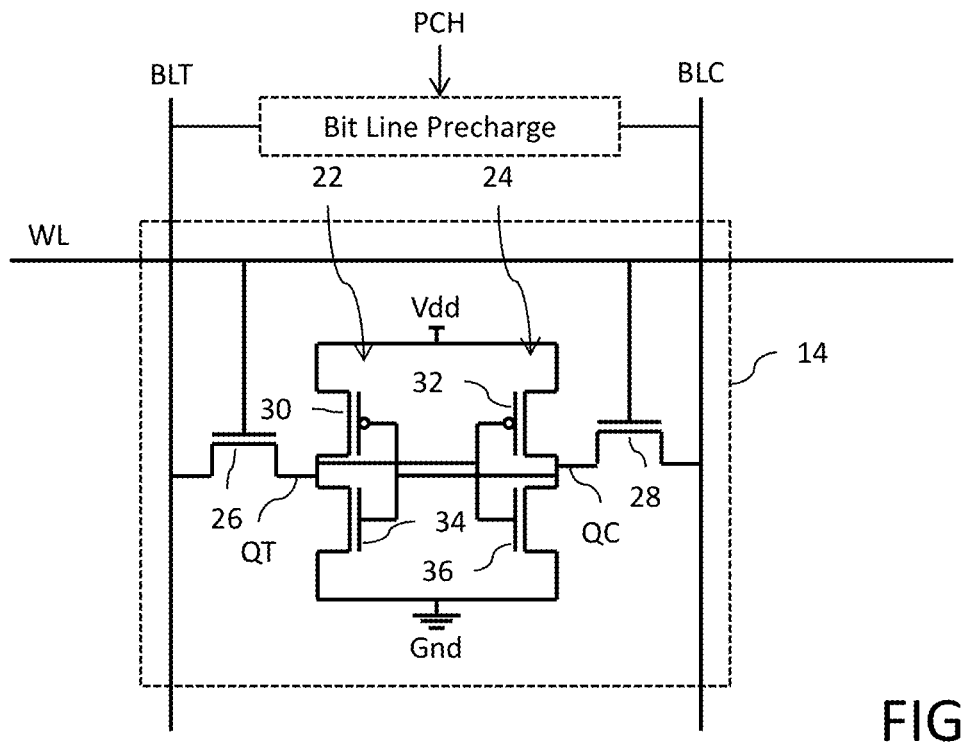
FIG. 2
(Prior Art)
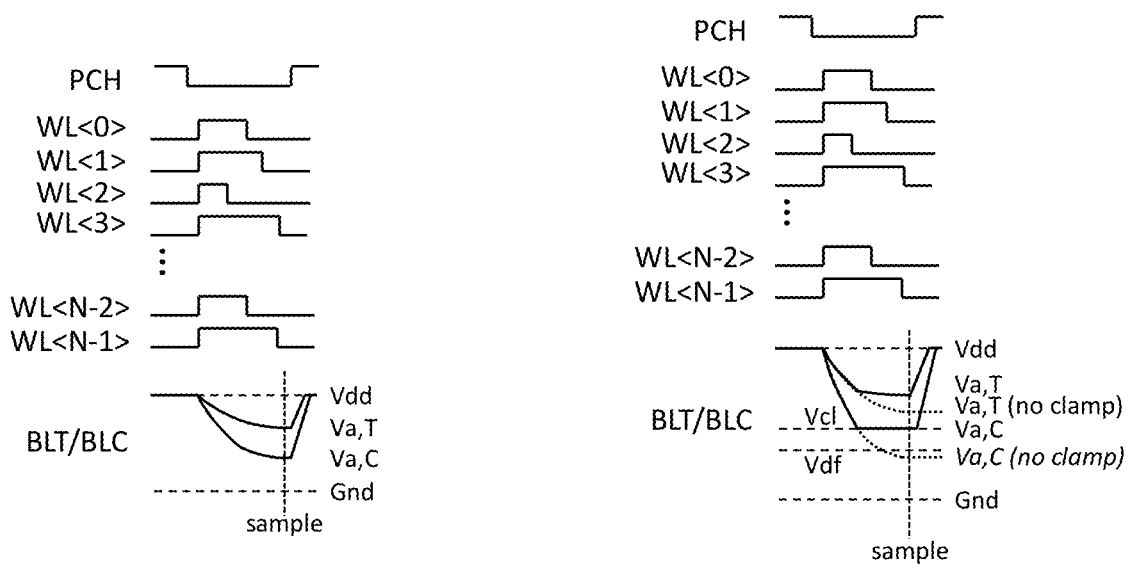
FIG. 3
FIG. 5

SELECTIVE BIT LINE CLAMPING CONTROL FOR AN IN-MEMORY COMPUTE OPERATION WHERE SIMULTANEOUS ACCESS IS MADE TO PLURAL ROWS OF A STATIC RANDOM ACCESS MEMORY (SRAM)

CROSS REFERENCE TO RELATED APPLICATIONS

This application claims priority from U.S. Provisional Application for Patent No. 63/219,987, filed Jul. 9, 2021, the disclosure of which is incorporated herein by reference.

TECHNICAL FIELD

Embodiments herein relate to an in-memory computation circuit utilizing a static random access memory (SRAM) array and, in particular, to the selective application of a clamping voltage to the bit line during a simultaneous access of multiple rows of the SRAM array for an in-memory compute operation.

BACKGROUND

Reference is made to FIG. 1 which shows a schematic diagram of an in-memory computation circuit 10. The circuit 10 utilizes a static random access memory (SRAM) array 12 formed by standard 6T SRAM memory cells 14 arranged in a matrix format having N rows and M columns. As an alternative, an 8T memory cell or other bit cell having a similar topology and functionality could instead be used. Each memory cell 14 is programmed to store a bit of a computational weight or feature data for an in-memory compute operation. In this context, the in-memory compute operation is understood to be a form of a high dimensional Matrix Vector Multiplication (MVM) supporting multi-bit weights that are stored in multiple bit cells of the memory. The group of bit cells (in the case of a multibit weight) can be considered as a virtual synaptic element. Each bit of the computational weight has either a logic "1" or a logic "0" value.

Each SRAM cell 14 includes a word line WL and a pair of complementary bit lines BLT and BLC. The 8T-type SRAM cell would additionally include a read word line RWL and a read bit line RBT. The cells 14 in a common row of the matrix are connected to each other through a common word line WL (and through the common read word line RWL in the 8T-type implementation). The cells 14 in a common column of the matrix are connected to each other through a common pair of complementary bit lines BLT and BLC (and through the common read bit line RBL in the 8T-type implementation). Each word line WL, RWL is driven by a word line driver circuit 16 which may be implemented as a CMOS driver circuit (for example, a series connected p-channel and n-channel MOSFET transistor pair forming a logic inverter circuit). The word line signals applied to the word lines, and driven by the word line driver circuits 16, are generated from feature data input to the in-memory computation circuit 10 and controlled by a row controller circuit 18. A column processing circuit 20 senses the analog signal voltages on the pairs of complementary bit lines BLT and BLC (and/or on the read bit line RBL) for the M columns and generates a decision output for the in-memory compute operation from those analog signal voltages. The column processing circuit 20 can be implemented to support processing where the voltages on the columns are first processed individually and then followed by a recombination of multiple column outputs.

Although not explicitly shown in FIG. 1, it will be understood that the circuit 10 further includes conventional row decode, column decode, and read-write circuits known to those skilled in the art for use in connection with writing bits of the computational weight to, and reading bits of the computational weight from, the SRAM cells 14 of the memory array 12.

With reference now to FIG. 2, each memory cell 14 includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two transfer (passgate) transistors 26 and 28 whose gate terminals are driven by a word line WL. The source-drain path of transistor 26 is connected between the true data storage node QT and a node associated with a true bit line BLT. The source-drain path of transistor 28 is connected between the complement data storage node QC and a node associated with a complement bit line BLC. The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, ground (Gnd) reference) at a low supply node. While FIG. 2 is specific to the use of 6T-type cells, those skilled in the art recognize that the 8T-type cell is similarly configured and would further include a signal path that is coupled to one of the storage nodes and includes a transfer (passgate) transistor coupled to the read word line RWL and gate driven by the signal on the read word line RWL. The word line driver circuit 16 is also typically coupled to receive the high supply voltage (Vdd) at the high supply node and is referenced to the low supply voltage (Gnd) at the low supply node.

The row controller circuit 18 performs the function of selecting which ones of the word lines WL<0> to WL<N−1> are to be simultaneously accessed (or actuated) in parallel during an in-memory compute operation, and further functions to control application of pulsed signals to the word lines in accordance with the feature date for that in-memory compute operation. FIG. 1 illustrates, by way of example only, the simultaneous actuation of all N word lines with the pulsed word line signals, it being understood that in-memory compute operations may instead utilize a simultaneous actuation of fewer than all rows of the SRAM array. The analog signal voltages which develop on a given pair of complementary bit lines BLT and BLC (or develop on the read bit line RBL in the 8T-type implementation) are dependent on the logic state of the bits of the computational weight or feature data stored in the memory cells 14 of the corresponding column and the width(s) of the pulsed word line signals applied to those memory cells 14 in response to the feature data.

The implementation illustrated in FIG. 1 shows an example in the form of a pulse width modulation (PWM) for the applied word line signals generated in response to the feature data for the in-memory compute operation. The use of PWM or period pulse modulation (PTM) for the applied word line signals is a common technique used for the in-memory compute operation based on the linearity of the vector for the multiply-accumulation (MAC) operation. The pulsed word line signal format can be further evolved as an encoded pulse train to manage block sparsity of the feature data of the in-memory compute operation. It is accordingly recognized that an arbitrary set of encoding schemes for the applied word line signals can be used when simultaneously driving multiple word lines in response to the feature data. Furthermore, in a simpler implementation, it will be understood that all applied word line signals in the simultaneous actuation may instead have a same pulse width.

A bit line precharge circuit 22 is connected to each pair of complementary bit lines BLT and BLC and functions in response to an assertion of a precharge control signal PCH to charge the bit lines to a precharge voltage level (for example, the level of the high supply voltage Vdd). The bit line precharge operation is performed prior to the simultaneous access of the word lines WL<0> to WL<N−1> during a computation cycle of the in-memory compute operation, and is also performed in connection with the normal operation to write data bits to, and read data bits from, the SRAM cells 14 of the memory array 12. Additionally, bit line precharge is applied at the end of each computation cycle of the in-memory compute operation to reset the bit line voltages in advance of the execution of the next computation cycle.

FIG. 3 is a timing diagram showing assertion (logic high) of the precharge control signal PCH to charge the pair of complementary bit lines BLT and BLC to the Vdd voltage level, and then the deassertion (logic low) of the precharge control signal PCH followed by the simultaneous application of the pulse width modulated word line signals to plural rows of memory cells 14 in the SRAM array 12 for the start of one computation cycle in response to the feature data of a given in-memory compute operation. Analog signal voltages Va,T and Va,C develop over time on the pair of complementary bit lines BLT and BLC, respectively, falling from the precharge voltage Vdd in response to the pulse width(s) of those word line signals and the logic state of the bits of the computational weight stored in the memory cells 14. The representation of the analog voltage Va levels as shown is just an example. The analog signal voltages Va,T and Va,C are sampled after completion of the application of the pulse width modulated word line signals and the computation cycle ends with the assertion (logic high) of the precharge control signal PCH.

It will be noted that a risk exists that the analog voltage on at least one of the bit lines BLT and BLC may fall from the Vdd voltage to a level where an unwanted data flip occurs with respect to the stored data bit value in one of the memory cells 14 of the column. For example, a logic "1" state stored in the cell 14 of a column may be flipped to a logic "0" state. This data flip introduces a data error in the computational weight stored in the memory cells, thus jeopardizing the accuracy of subsequent in-memory compute operations.

The unwanted data flip that occurs due to an excess of bit line voltage lowering is mainly an effect of the simultaneous parallel access of the word lines in matrix vector multiplication mode during the in-memory compute operation. This problem is different from normal data flip of an SRAM bit cell due to Static-Noise-Margin (SNM) issues which happens in serial bit cell access when the bit line is close to the level of the supply voltage Vdd. During serial access, the normal data flip is instead caused by a ground bounce of the data storage nodes QT or QC at the bit cell.

There is a need in the art to support in-memory computation circuit use of SRAM cells while ensuring against unwanted data flip during simultaneous row access.

SUMMARY

In an embodiment, a circuit comprises: a memory array including a plurality of static random access memory (SRAM) cells arranged in a matrix with plural rows and plural columns, each row including a word line connected to the SRAM cells of the row, and each column including at least one bit line connected to the SRAM cells of the column; a word line driver circuit for each row having an output connected to drive the word line of the row; a row controller circuit configured to simultaneously actuate the plurality of word lines by applying pulses through the word line driver circuits to the word lines for an in-memory compute operation; a column processing circuit connected to the bit line for each column and configured to process an analog voltage developed on the bit line in response to the simultaneous actuation of the plurality of word lines to generate a decision output for the in-memory compute operation; and a bit line clamping circuit comprising a sensing circuit configured to compare the analog voltage on a given bit line to a threshold voltage and a voltage clamp circuit that is actuated in response to the comparison to preclude the analog voltage on that given bit line from decreasing below a clamping voltage level.

In an embodiment, a circuit comprises: a memory array including a plurality of static random access memory (SRAM) cells arranged in a matrix with plural rows and plural columns, each row including a word line connected to the SRAM cells of the row, and each column including a pair of bit lines connected to the SRAM cells of the column; a word line driver circuit for each row having an output connected to drive the word line of the row; a row controller circuit configured to simultaneously actuate the plurality of word lines by applying pulses through the word line driver circuits to the word lines for an in-memory compute operation; a column processing circuit connected to the pair of bit lines for each column and configured to process analog voltages developed on the pair of bit lines in response to the simultaneous actuation of the plurality of word lines to generate a decision output for the in-memory compute operation; and a bit line clamping circuit comprising a sensing circuit configured assert a clamp actuate signal if the analog voltage on either bit line of a given pair of bit lines fall below a threshold voltage and a voltage clamp circuit that is actuated in response to assertion of the clamp actuate signal to clamp the analog voltages on that given pair of bit lines to a clamping voltage level.

BRIEF DESCRIPTION OF THE DRAWINGS

For a better understanding of the embodiments, reference will now be made by way of example only to the accompanying figures in which:

FIG. 2 is a circuit diagram of a standard 6T static random access memory (SRAM) cell as used in the memory array of the in-memory computation circuit shown in FIG. 1;

FIG. 3 is a timing diagram illustrating an in-memory compute operation for the circuit of FIG. 1;

FIG. 5 is a timing diagram illustrating an in-memory compute operation for the circuit of FIG. 4;

DETAILED DESCRIPTION OF THE DRAWINGS

Figure 1:
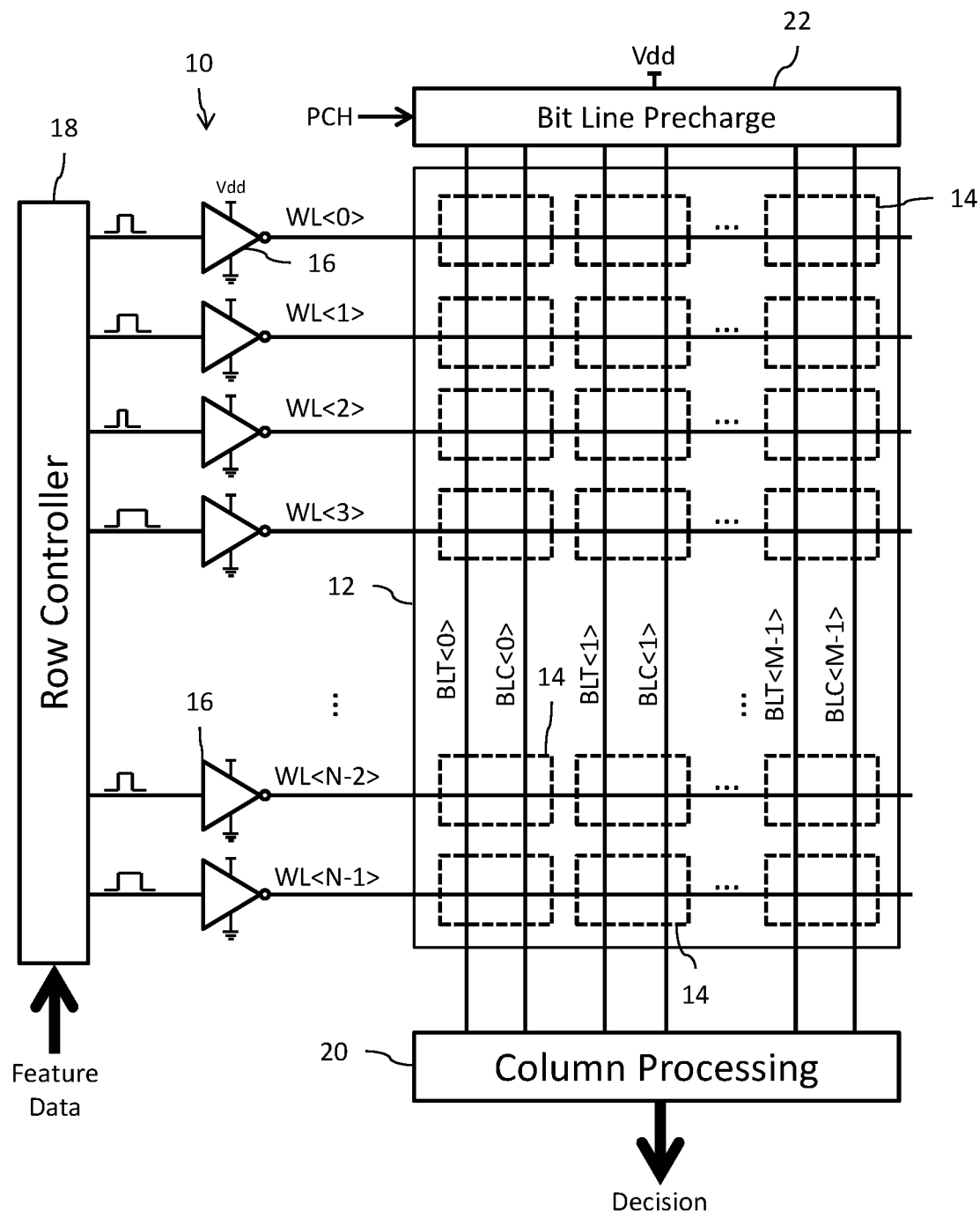
FIG. 1 is a schematic diagram of an in-memory computation circuit.
Figure 4:
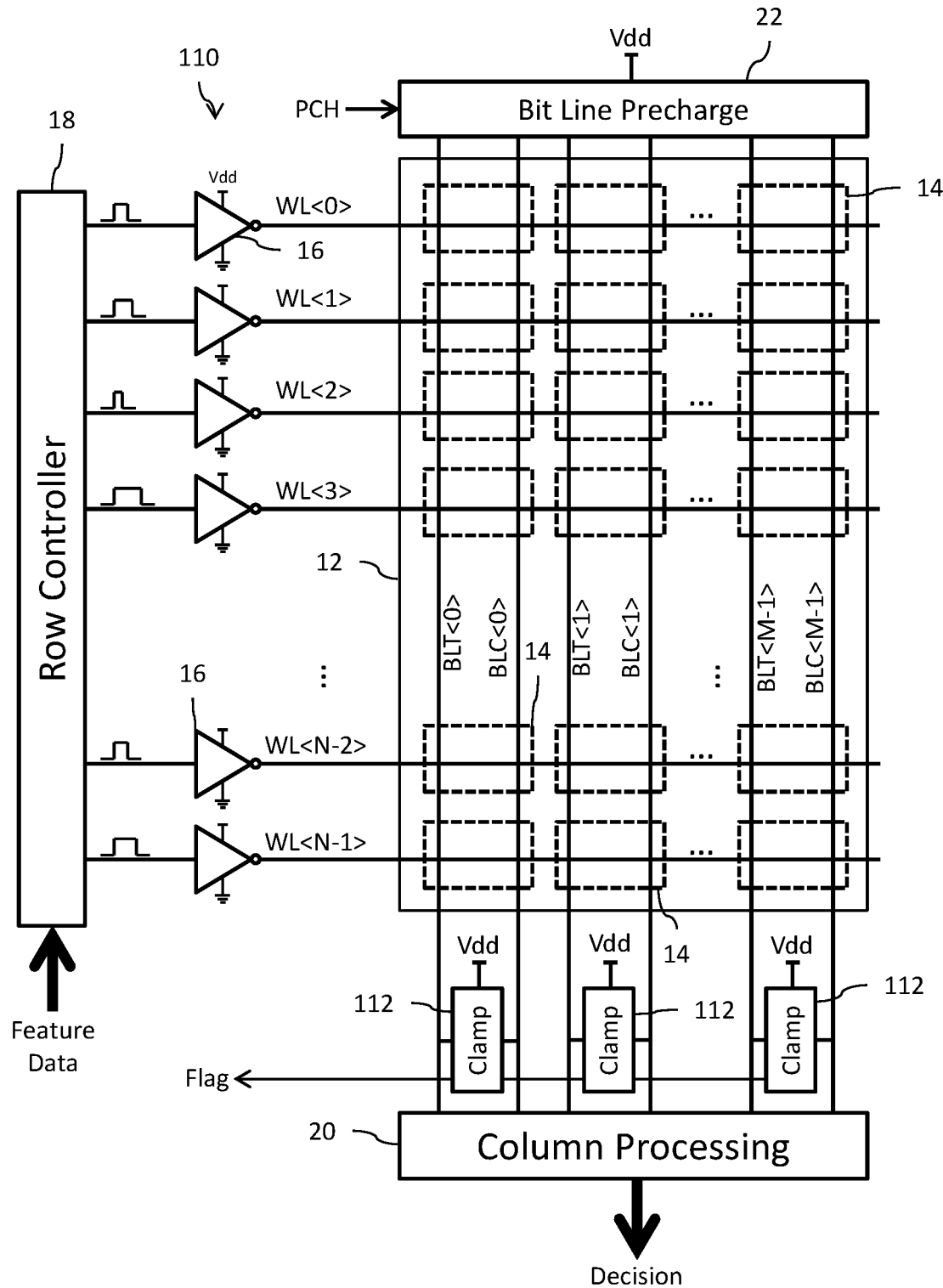
FIG. 4 is a schematic diagram of an in-memory computation circuit utilizing a selective bit line clamping operation.

Reference is now made to FIG. 4 which shows a schematic diagram of an in-memory computation circuit 110 utilizing a selective bit line clamping operation. Like references in FIGS. 1 and 4 refer to like or similar components, the description of which will not be repeated (see, description above). The circuit 110 differs from the circuit 10 in that a selective clamping circuit 112 is coupled to each pair of bit lines BLT and BLC. The selective clamping circuit 112 operates to sense the voltage level on each bit line BLT, BLC and determine whether the bit line voltage has fallen from the precharge voltage level (Vdd) to a level below a threshold voltage level. If the sensed voltage on either bit line BLT, BLC reaches the threshold voltage level, a voltage clamp circuit is activated to preclude further decrease of the bit line voltage below a clamping voltage level Vcl and cause the voltages on both bit lines BLT, BLC to be clamped to that clamping voltage level Vcl.

The clamping voltage level Vcl is specifically set by circuit design, calibration and/or modulation to be higher than a voltage Vdf where there is a risk that an unwanted data flip in a memory cell 14 could occur. In an embodiment, the clamping voltage level Vcl may have a nominal voltage substantially equal to (i.e., within plus/minus a few percent) about one-half of the supply voltage (i.e., Vdd/2). Some selected modulation of the clamping voltage level Vcl plus/minus some amount away from the nominal Vdd/2 voltage may be supported in view of integrated circuit process and/or temperature conditions.

In an embodiment, the threshold voltage level for triggering actuation of the voltage clamping circuit may be substantially equal to (i.e., within plus/minus a few percent of) the clamping voltage level Vcl. In any case, however, the threshold voltage level for triggering actuation of the voltage clamping circuit is preferably set at a level where the risk of an unwanted data flip is a concern.

The selective clamping circuits 112 may be configured to generate a flag signal (Flag) each time the voltage clamp circuit is activated. This flag signal can provide feedback to the in-memory computation system to indicate that some loss of sensitivity in the in-memory compute operation has occurred due to activation of the bit line clamping function. Based on this information, some corrective action can be taken by the in-memory computation system (for example, by taking an action to repeat the computation cycle with a data reorganization designed to preclude generation of the dangerous analog voltage level or taking an action to ignore the results of this specific computation cycle where the flag is asserted). Additionally, based on this information, the in-memory computation system can evaluate whether the decision output for the in-memory compute operation can be considered as valid, notwithstanding the loss of sensitivity due to activation of the bit line clamping function.

Although the selective clamping circuits 112 are shown as distinct from the bit line precharge circuit 22, it will be understood that in an embodiment the selective clamping circuits 112 may be implemented as a part of the bit line precharge circuit 22.

FIG. 5 is a timing diagram showing assertion (logic high) of the precharge control signal PCH to charge the pair of complementary bit lines BLT and BLC to the Vdd voltage level, and then the deassertion (logic low) of the precharge control signal PCH followed by the simultaneous application of the pulse width modulated word line signals to plural rows of memory cells 14 in the SRAM array 12 for the start of one computation cycle of a given in-memory compute operation. Analog signal voltages Va,T and Va,C develop over time on the pair of complementary bit lines BLT and BLC, respectively, falling from the precharge voltage Vdd in response to the pulse width(s) of those word line signals in response to the feature data and the logic state of the bits of the computational weight or feature data stored in the memory cells 14. The representation of the analog voltage Va levels as shown is just an example. The dotted line representations for the analog voltages Va,T and Va,C shows how the voltages would develop in the absence of the operation of the clamping circuit. In particular, it will be noted that the analog voltage Va,C would develop a voltage level that falls below the data flip voltage Vdf and thus risk occurrence of an unwanted data flip in absence of a clamping operation. The clamping voltage level Vcl is set higher than the voltage Vdf, and thus the voltage clamp circuit within the selective clamping circuit 112 will be activated in response to the analog voltage Va,C reaching the threshold voltage level (shown here to be at or about the same level as the clamping voltage level Vcl) to clamp the level of the analog voltage Va,C at the clamping voltage level Vcl and preclude further decrease in the voltage on the complement bit line BLC. Due to differential signaling effects, there is an alteration of the analog Va,T as well due to the actuation of the clamping circuit. The analog signal voltages Va,T and Va,C are sampled after completion of the application of the pulse width modulated word line signals in response to the feature data and the computation cycle ends with the assertion (logic high) of the precharge control signal PCH.

Figure 6A:
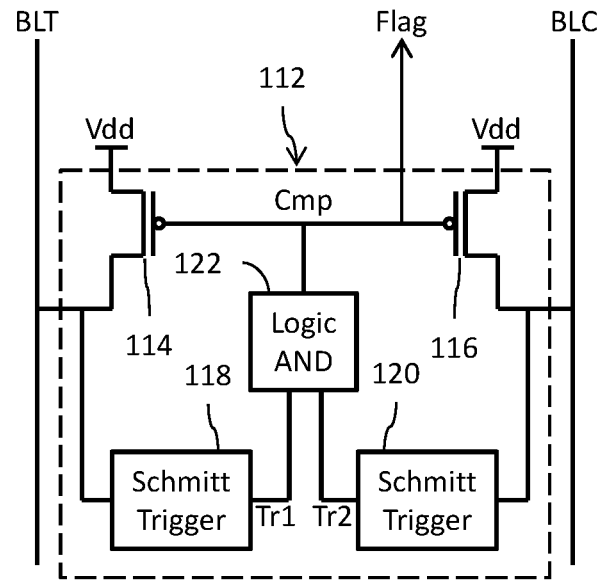
FIG. 6A is a circuit diagram for an embodiment of a selective clamping circuit for the circuit of FIG. 4.

Reference is now made to FIG. 6A which shows a circuit diagram for an embodiment of the selective clamping circuit 112. The circuit 112 includes a first p-channel MOSFET device 114 having a source coupled (preferably directly connected) to the supply voltage Vdd node and a drain coupled (preferably directly connected) to the true bit line BLT. A second p-channel MOSFET device 116 has a source coupled (preferably directly connected) to the supply voltage Vdd node and a drain coupled (preferably directly connected) to the complement bit line BLC. The gates of the first and second transistors 114 and 116 are coupled (preferably directly connected) to each other and are driven by a clamp actuate signal Cmp. For simplicity, logic circuitry configured to disable operation of the clamping circuits 112 during conventional memory read/write operations is not shown. The transistors 114 and 116 form the voltage clamp circuit that is selectively actuated using the clamp actuate signal Cmp.

A first detection circuit 118 (for example, comprising a Schmitt trigger circuit or series connected MOS inverter circuits) for threshold crossing detection has an input coupled (preferably directly connected) to the true bit line BLT, and a second detection circuit 120 (for example, comprising a Schmitt trigger circuit or series connected MOS inverter circuits) for threshold crossing detection has an input coupled (preferably directly connected) to the complement bit line BLC. The first and second detection circuits 118, 120 are configured to sense the voltage levels on the true and complement bit lines BLT, BLC, respectively. A comparison of the sensed bit line voltage against a threshold voltage level is made by each detection circuit 118, 120, with the threshold voltage level being the high-to-low threshold switching voltage set by the circuit configuration of the detection circuit. The output of each detection circuit 118, 120 generates a trigger signal Tr1, Tr2, respectively, having logic level associated with the result of the comparison of the sensed bit line voltage to the threshold voltage level. The trigger signals Tr1, Tr2 output from the detection circuits 118, 120 are logically combined by a logic circuit 122 to generate the clamp actuate signal Cmp. In an embodiment, the logic circuit is a logic AND gate, and each trigger signal Tr1, Tr2 would be asserted logic low in the event that the threshold voltage level is crossed. The detection circuits 118, 120 and logic circuit 122 together form a sensing circuit which controls actuation of the voltage clamp circuit formed by transistors 114 and 116. When either trigger signal Tr1 or Tr2 is asserted logic low, the clamp actuate signal Cmp is likewise asserted logic low through the AND logic and both of the first and second transistors 114 and 116 are turned on to actuate the voltage clamp circuit and clamp the maximum permitted voltage drop on the pair of bit lines BLT and BLC to the clamping voltage level Vcl. Conversely, when both trigger signals Tr1 and Tr2 are asserted logic high, the clamp actuate signal Cmp is likewise asserted logic high through the AND logic in order to turn off the first and second transistors 114 and 116.

The level of the high to low switching threshold for each detection circuit 118, 120 (i.e., the threshold voltage level) may be tuned by the circuit designer to ensure that the level is sufficient to protect against unwanted data flip while still permitting a sufficient voltage swing on the bit lines. Additionally, some process dependent compensation of the detection circuit can be designed in order to tune the threshold voltage level. In this regard, it will be noted that the data flip voltage Vdf level is process dependent and tuning of the threshold voltage level as function of this process dependency will effectuate and adjustment of the clamping circuit operation to provide the necessary protection while also allowing the circuit to achieve a better (higher) bit line swing range.

In this implementation, the clamp actuate signal Cmp may further comprise the flag signal (Flag). Alternatively, the clamp actuate signal Cmp may be input to a logic circuit which responds to assertion of the clamp actuate signal Cmp by controlling assertion of the flag signal.

Figure 6B:
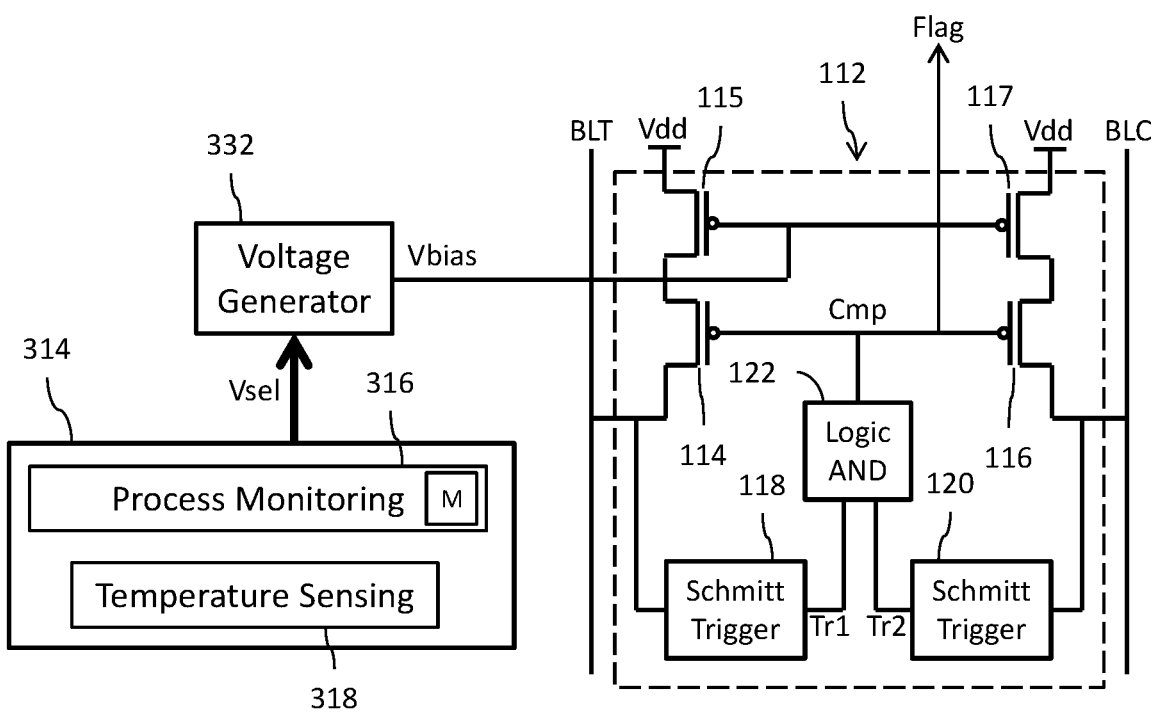
FIG. 6B is a circuit diagram for an enhancement of the embodiment for the selective clamping circuit shown in FIG. 6A.

FIG. 6B shows a circuit diagram for an enhancement of the embodiment for the selective clamping circuit shown in FIG. 6A. Like references in FIGS. 6A and 6B refer to like or similar components. The circuit 112 in FIG. 6B is similar to the circuit 112 in FIG. 6A except as follows. The circuit 112 includes a first p-channel MOSFET device 114 having a source coupled (preferably directly connected) to a first intermediate node and a drain coupled (preferably directly connected) to the true bit line BLT. A second p-channel MOSFET device 116 has a source coupled (preferably directly connected) to a second intermediate node and a drain coupled (preferably directly connected) to the complement bit line BLC. The gates of the first and second transistors 114 and 116 are coupled (preferably directly connected) to each other and are driven by the clamp actuate signal Cmp. A third p-channel MOSFET device 115 has a source coupled (preferably directly connected) to the supply voltage Vdd node and a drain coupled (preferably directly connected) to the first intermediate node. A fourth p-channel MOSFET device 117 has a source coupled (preferably directly connected) to the supply voltage Vdd node and a drain coupled (preferably directly connected) to the second intermediate node. The gates of the third and fourth transistors 115 and 117 are coupled (preferably directly connected) to each other and are driven by a bias voltage Vbias. The voltage level of the bias voltage Vbias is modulated dependent on integrated circuit process and/or temperature conditions in order to effectuate control over setting a strength of clamping circuit operation in clamping the bit lines to the clamping voltage Vcl. The transistors 114, 115, 116 and 117 form the voltage clamp circuit that is selectively actuated by the sensing circuit using the clamp actuate signal Cmp.

A voltage generator circuit 332 receives a control signal Vsel. In an embodiment, the control signal Vsel is a multi-bit digital signal, but it will be understood that the control signal can instead be implemented as an analog signal. The value of the control signal (in particular, the digital values of the bits of the control signal Vsel) select the level of the bias voltage Vbias output by the voltage generator circuit 332. The control signal Vsel is generated by a control circuit 314 in response to integrated circuit process and/or temperature information, and thus the level of the bias voltage Vbias is modulated in a manner which is dependent on that integrated circuit process and/or temperature information.

The integrated circuit process information is a digital code generated and stored in a memory M within the control circuit 314. The digital code represents the centering of the process lot and is generated by circuitry such as, for example, ring oscillators (RO) whose output frequency varies dependent on integrated circuit process. The output frequencies of the RO circuits thus represent the process centering and can easily be converted into a digital code (for example, through the use of counter circuits). A process monitoring circuit 316 within the control circuit 314 can generate the value of the control signal Vsel as a function of the stored digital code for the integrated circuit process. For example, the process monitoring circuit 316 may include a look-up table (LUT) that correlates each digital code with a value of the control signal Vsel for providing a specific level of the bias voltage Vbias that will produce an optimal level of strength for clamping circuit operation in clamping to the bit line clamping voltage Vcl for the integrated circuit process corner (i.e., control the conductivity of the third and fourth MOSFET devices 115 and 117 so as to set the strength of the clamped circuit operation when the clamp actuate signal Cmp is asserted and the transistors 114 and 116 are turned on). The control circuit 314 outputs the digital value of the control signal Vsel correlated to the stored digital code and the voltage generator circuit 332 responds by generating the corresponding level for the bias voltage Vbias.

The temperature information is generated by a temperature sensing circuit 318 and represents a current temperature of the integrated circuit. The temperature sensing circuit 318 may select, modify or adjust the digital value of the control signal Vsel as a function of the sensed temperature. For example, the temperature sensing circuit 318 may include a look-up table (LUT) that specifies a certain (positive or negative) adjustment in the digital value of the control signal Vsel for providing a corresponding tuning of the specific level of the bias voltage Vbias that will produce optimal bit line clamping circuit performance given the integrated circuit process corner and current temperature condition.

Figure 9:
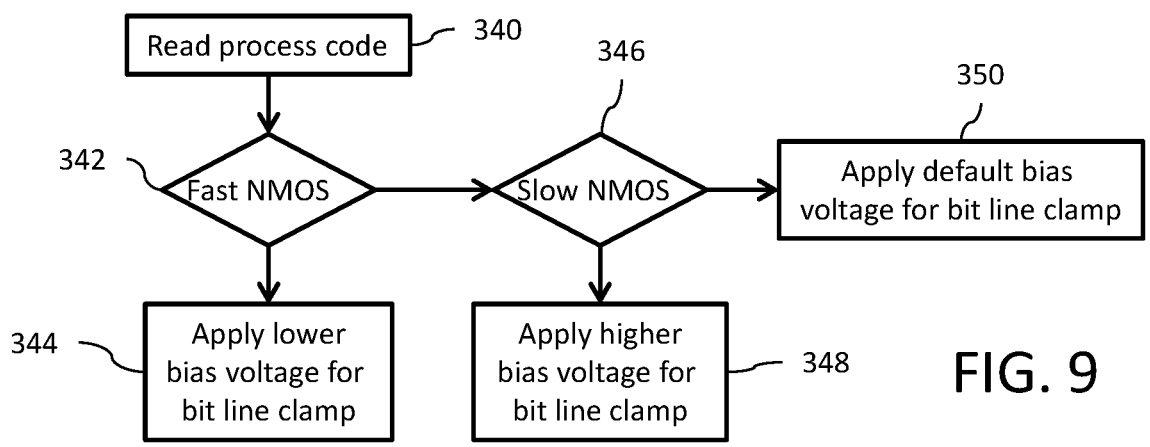
FIG. 9 is a flow diagram.

Reference is now made to FIG. 9 which shows a flow diagram for operation of the control circuit 314 and process monitoring circuit 316 for the circuit of FIG. 6B. In step 340, the stored digital code for the integrated circuit process is read from the memory M. In an embodiment, the digital code for the integrated circuit process is loaded at the factory into the memory M, and this digital code is based on the identified integrated circuit process characteristic (fast/slow corner, etc.) for the integrated circuit fabrication lot (for example, the source wafer) from which the integrated circuit is obtained. Next, in step 342, a determination is made as to whether the read digital code for the integrated circuit process indicates that the NMOS devices of the memory cells 12 are at the fast integrated circuit process corner. If yes, then a digital value of the control signal Vsel is selected in step 344 which corresponds to the read digital code and which will cause the voltage generator circuit 332 to generate the level of the bias voltage Vbias lower than a nominal (or default) level in order to set a higher clamping strength in connection with clamping the bit line voltages to the bit line clamping voltage Vcl level. If no in step 342, then in step 346 a determination is made as to whether the read digital code for the integrated circuit process indicates that the NMOS devices of the memory cells 12 are at the slow integrated circuit process corner. If yes, then a digital value of the control signal Vsel is selected in step 348 which corresponds to the read digital code and which will cause the voltage generator circuit 332 to generate the level of the bias voltage Vbias higher than the nominal (or default) level in order to set a lower clamping strength in connection with clamping the bit line voltages to the bit line clamping voltage Vcl level. If no in step 346, then a digital value of the control signal Vsel is selected in step 350 which corresponds to the read digital code and which will cause the voltage generator circuit 332 to generate a level for the bias voltage Vbias that is equal to the nominal (or default) level in setting the clamping strength. Although the process of FIG. 9 contemplates three levels of voltage control (higher than, lower than, and equal to, nominal), it will be understood that this is by example only. Additional testing steps may be added to the process of FIG. 9 to test for other integrated circuit process corner or process-related conditions, with each test having an associated digital code and digital value of the control signal Vsel for setting a corresponding level of the bias voltage Vbias generated by the voltage generator circuit 332 in order to modulate the strength of the bit line clamping circuit to clamp the bit lines to the bit line clamping voltage Vcl.

In the implementation of the circuit 112 shown in FIG. 6B, the conductivity of the third and fourth MOSFET devices 115 and 117 is analog voltage controlled through the applied bias voltage Vbias. In alternative implementation, each of the third and fourth MOSFET devices 115 and 117 may be replaced by a plurality of parallel connected MOSFET devices whose gates are individually controlled by a corresponding bit of a multibit digital signal. For example, that digital signal used for the digital control could comprise the digital control signal Vsel, in which case the voltage generator circuit 332 may be omitted. In such a case, with respect to the process shown in FIG. 9, the digital value of the control signal Vsel that is selected in step 344 and which corresponds to the read digital code for the fast process corner will cause a larger number of the plurality of parallel connected MOSFET devices to be actuated than the nominal (or default) number. Conversely, the digital value of the control signal Vsel that is selected in step 348 and which corresponds to the read digital code for the slow process corner will cause a smaller number of the plurality of parallel connected MOSFET devices to be actuated than the nominal (or default) number. Finally, the digital value of the control signal Vsel that is selected in step 350 will cause a nominal number of the plurality of parallel connected MOSFET devices to be actuated.

Figure 7A:
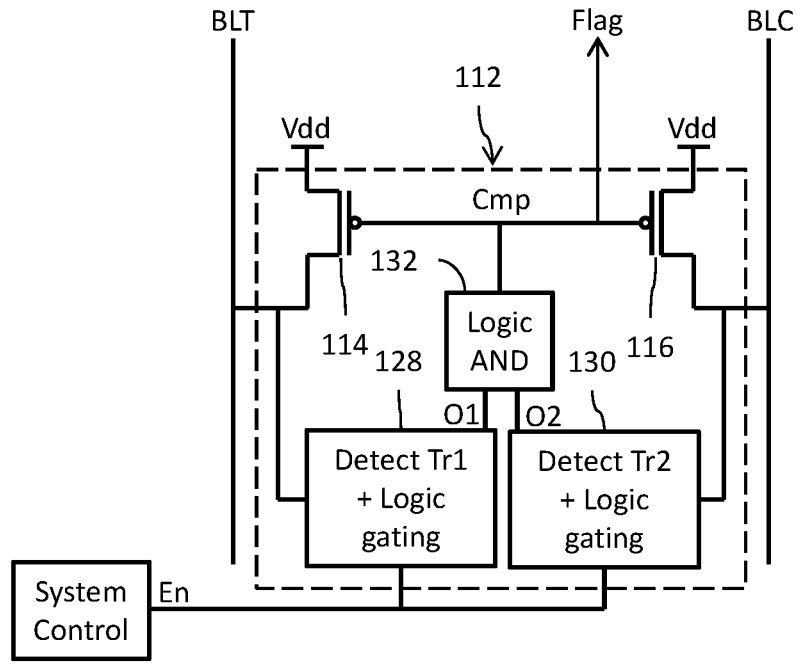
FIG. 7A is a circuit diagram for another embodiment of a selective clamping circuit for the circuit of FIG. 4.

Reference is now made to FIG. 7A which shows a circuit diagram for another embodiment of the selective clamping circuit 112. The circuit 112 includes a first p-channel MOSFET device 114 having a source coupled (preferably directly connected) to the supply voltage Vdd node and a drain coupled (preferably directly connected) to the true bit line BLT. A second p-channel MOSFET device 116 has a source coupled (preferably directly connected) to the supply voltage Vdd node and a drain coupled (preferably directly connected) to the complement bit line BLC. The gates of the first and second transistors 114 and 116 are coupled (preferably directly connected) to each other and are driven by a clamp actuate signal Cmp. For simplicity, logic circuitry configured to disable the clamping circuit during conventional memory read/write operations is not shown. The transistors 114 and 116 form the voltage clamp circuit that is selectively actuated using the clamp actuate signal Cmp.

A first circuit 128 includes a detection circuit (for example, comprising a Schmitt trigger circuit or series connected MOS inverter circuits) 118' for threshold crossing detection having an input coupled (preferably directly connected) to the true bit line BLT, and a second circuit 130 includes a detection circuit (for example, comprising a Schmitt trigger circuit or series connected MOS inverter circuits) 120' for threshold crossing detection having an input coupled (preferably directly connected) to the complement bit line BLC. The detection circuits 118, 120 (see, FIG. 6A) are configured to sense the voltage levels on the true and complement bit lines BLT, BLC, respectively. A comparison of the sensed bit line voltage against a threshold voltage level is made by each detection circuit with the threshold voltage level. The output of each detection circuit 118, 120 is a trigger signal Tr1, Tr2, respectively, having logic level associated with a result of the comparison of the sensed bit line voltage to the threshold voltage level. The trigger signal Tr1 is logically combined (for example, logically gated or logically processed using a NAND logic circuit) in circuit 128 by an enable clamp signal En to generate an output signal O1. Similarly, the trigger signal Tr2 is logically combined (for example, logically gated or logically processed using a NAND logic circuit) in circuit 130 with the enable clamp signal En to generate an output signal O2. The output signals O1, O2 output from the circuits 128, 130 are logically combined by a logic circuit 132 to generate the clamp actuate signal Cmp. In an embodiment, the logic circuit 132 is a logic AND gate. The detection circuits 128, 130 and logic circuit 132 together form a sensing circuit which controls actuation of the voltage clamp circuit formed by transistors 114 and 116. If the enable clamp signal En is asserted, when either trigger signal Tr1 or Tr2 is asserted logic low, the clamp actuate signal Cmp is likewise asserted logic low through the logic circuits and both of the first and second transistors 114 and 116 are turned on to actuate the voltage clamp circuit and clamp the maximum permitted voltage drop on the pair of bit lines BLT and BLC to the clamping voltage level Vcl. Conversely, if the enable clamp signal En is deasserted, or if both trigger signals Tr1 and Tr2 are asserted logic high, the clamp actuate signal Cmp is likewise asserted logic high through the logic circuits in order to turn off the first and second transistors 114 and 116. The assertion/deassertion of the enable clamp signal En determines whether the bit line clamping protection provided by the selective clamping circuit 112 is enabled for operation. In this regard, there may be instances where it is desired for bit line clamping to not be active and deasserting the enable clamp signal En will cause this to happen. In this condition, the outputs O1 and O2 of the first and second logic 128 and 130 will each be forced to a logic high state and the logic AND circuit will set the clamp actuate signal Cmp logic high to force both of the first and second transistors 114 and 116 to turn off.

The enable clamp signal En may be generated by a control circuit of the overall system. The same enable clamp signal En may be applied by the control circuit to all of the selective clamping circuits 112. Alternatively, an individual enable clamp signal En may be applied by the control circuit to each selective clamping circuit 112. The determination as whether the control circuit will assert/deassert the enable clamp signal En can be made based on data and layer statistics. For example, the enable clamp signal En may be deasserted dependent on the data values for the computational weights stored in the memory. For example, if the stored computational weights for the in-memory compute operation are viewed as being unlikely because of their arrangement in the memory to result in a bit line voltage drop that could cause an unwanted data flip, then there is no need to enable operation of the clamping function. Furthermore, the enable clamp signal En may be deasserted dependent on the feature (sensor) data for the in-memory compute operation. For example, if the feature (sensor) data are viewed as being unlikely because of their values to result in a bit line voltage drop that could cause an unwanted data flip, then the control circuit can deassert the enable clamp signal En and disable the clamping function.

In this implementation, the clamp actuate signal Cmp may further comprise the flag signal (Flag). Alternatively, the clamp actuate signal Cmp may be input to a logic circuit which responds to assertion of the clamp actuate signal Cmp by controlling assertion of the flag signal.

Figure 7B:
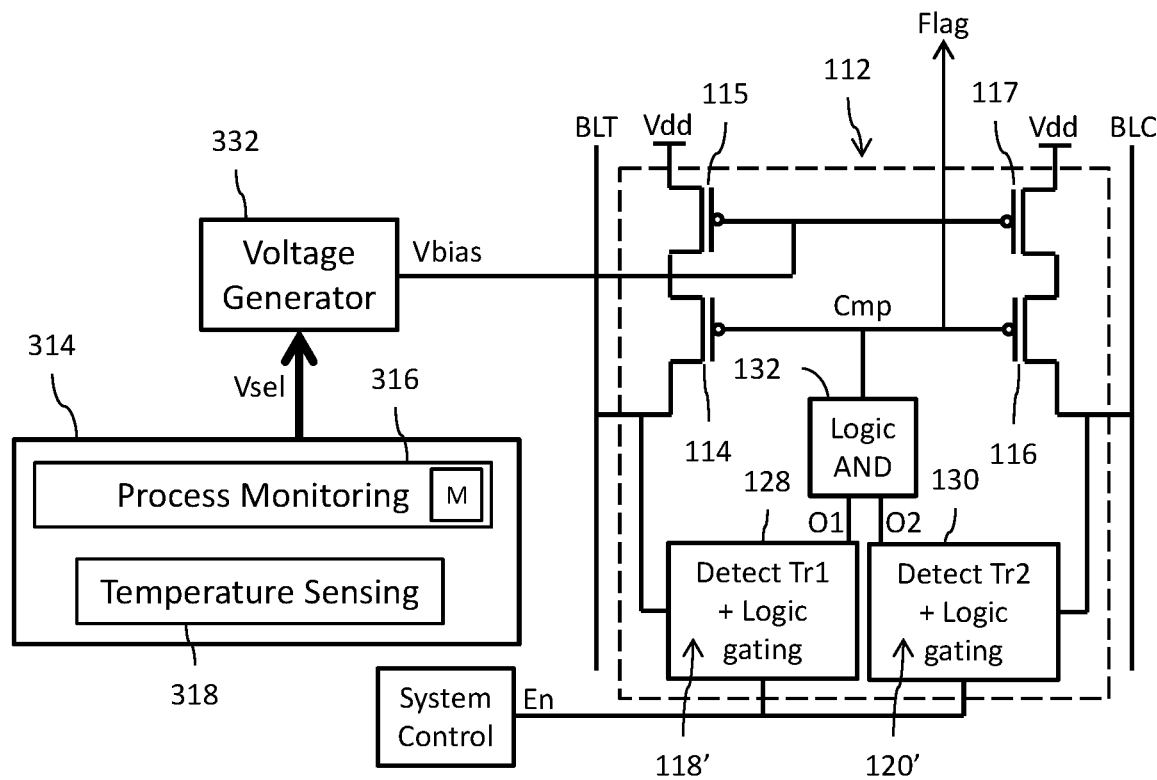
FIG. 7B is a circuit diagram for an enhancement of the embodiment for the selective clamping circuit shown in FIG. 7A.

FIG. 7B shows a circuit diagram for an enhancement of the embodiment for the selective clamping circuit shown in FIG. 7A which utilizes the circuits as shown in FIG. 6B relating to controlling the clamping voltage in response to a modulated bias voltage Vbias. Like references in FIGS. 7B and 6B refer to like or similar components, the description of which will not be repeated (see, description above).

Figure 8A:
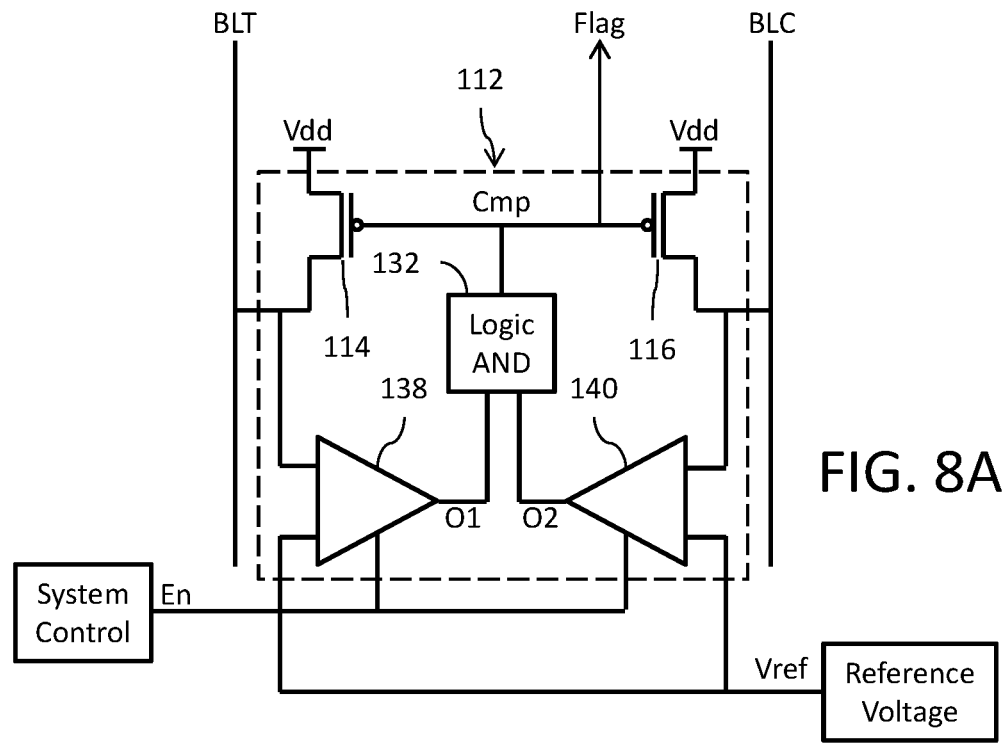
FIG. 8A is a circuit diagram for a further embodiment of a selective clamping circuit for the circuit of FIG. 4.

Reference is now made to FIG. 8A which shows a circuit diagram for a further embodiment of the selective clamping circuit 112. The circuit 112 includes a first p-channel MOSFET device 114 having a source coupled (preferably directly connected) to the supply voltage Vdd node and a drain coupled (preferably directly connected) to the true bit line BLT. A second p-channel MOSFET device 116 has a source coupled (preferably directly connected) to the supply voltage Vdd node and a drain coupled (preferably directly connected) to the complement bit line BLC. The gates of the first and second transistors 114 and 116 are coupled (preferably directly connected) to each other and are driven by a clamp actuate signal Cmp. For simplicity, logic circuitry configured to disable the clamping circuit during conventional memory read/write operations is not shown. The transistors 114 and 116 form the voltage clamp circuit that is selectively actuated using the clamp actuate signal Cmp.

A first differential amplifier circuit 138 has a first input coupled (preferably directly connected) to the true bit line BLT and a second input coupled to receive a reference voltage Vref. The first differential amplifier circuit 138 is enabled for differential operation in response to an enable clamp signal En. A second differential amplifier circuit 140 has a first input coupled (preferably directly connected) to the complement bit line BLC and a second input coupled to receive the reference voltage Vref. The second differential amplifier circuit 140 is enabled for differential operation in response to the enable clamp signal En. The output signals O1 and O2 from the differential amplifier circuits 138, 140 are logically combined by a logic AND circuit 132 to generate the clamp actuate signal Cmp. The amplifier circuits 138, 140 and logic AND circuit 132 together form a sensing circuit which controls actuation of the voltage clamp circuit formed by transistors 114 and 116.

The logic value of the enable clamp signal En determines whether the bit line clamping protection provided by the selective clamping circuit 112 is enable or disabled. In this regard, there may be instances where it is desired for bit line clamping to be deactivated and deasserting the enable clamp signal En will cause this to happen. In this condition, the outputs O1 and O2 of the first and second differential amplifier circuits 138 and 140 will each be logic high and the logic AND circuit will deassert the clamp actuate signal Cmp logic high to turn off both of the first and second transistors 114 and 116.

However, when the enable clamp signal En is asserted, the first and second differential amplifier circuits 138 and 140 are enabled for operation to perform the comparison and the generation of a logic low signal at either of the outputs O1 and O2 of the first and second differential amplifier circuits 138 and 140 is dependent on the sensed bit line voltage falling from the precharge voltage level Vdd to below a threshold voltage set by the reference voltage Vref. In response to a logic low state for either of the outputs O1 and O2 (which occurs when the sensed bit line voltage falls below the threshold voltage), the logic AND circuit will assert the clamp actuate signal Cmp logic low to turn on both of the first and second transistors 114 and 116 to clamp the maximum permitted voltage drop on the pair of bit lines BLT and BLC.

The enable clamp signal En may be generated by a control circuit of the overall system. The same enable clamp signal En may be applied by the control circuit to all of the selective clamping circuits 112. Alternatively, an individual enable clamp signal En may be applied by the control circuit to each selective clamping circuit 112. The determination as whether the control circuit will assert/deassert the enable clamp signal En can be made based on data and layer statistics. For example, the enable clamp signal En may be deasserted dependent on the data values for the computational weights stored in the memory. For example, if the stored computational weights for the in-memory compute operation are viewed as being unlikely because of their arrangement in the memory to result in a bit line voltage drop that could cause an unwanted data flip, then there is no need to enable operation of the clamping function. Furthermore, the enable clamp signal En may be deasserted dependent on the feature (sensor) data for the in-memory compute operation. For example, if the feature (sensor) data are viewed as being unlikely because of their values to result in a bit line voltage drop that could cause an unwanted data flip, then the control circuit can deassert the enable clamp signal En and disable the clamping function.

It will further be noted that the use of the enable clamp signal En is optional in an embodiment of this selective clamping circuit 112. In other words, the first and second differential amplifier circuits 138 and 140 are configured in this mode to always operate in the differential comparison mode where the logic state of the outputs O1 and O2 is solely dependent on the comparison of the bit line voltages to the reference voltage Vref.

In an implementation, the clamp actuate signal Cmp may further comprise the flag signal (Flag). Alternatively, the clamp actuate signal Cmp may be input to a logic circuit which responds to assertion of the clamp actuate signal Cmp by controlling assertion of the flag signal.

Figure 8B:
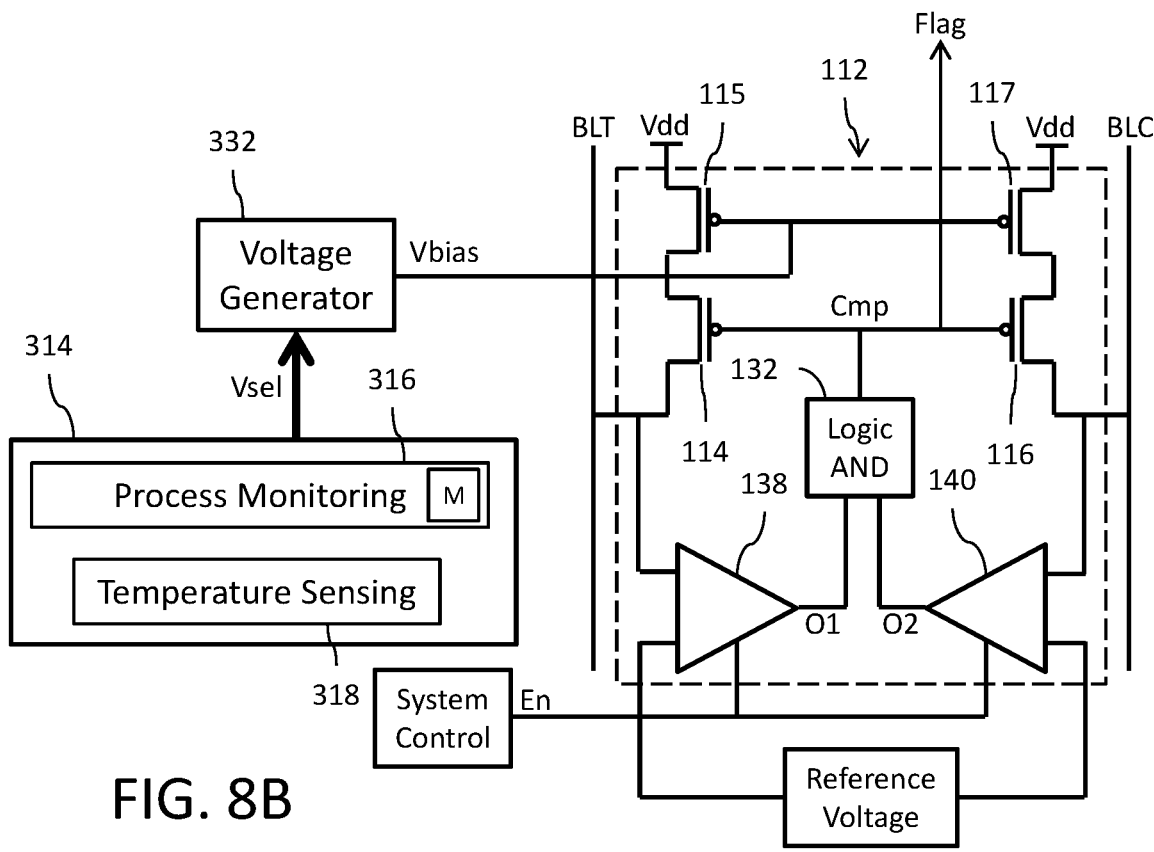
FIG. 8B is a circuit diagram for an enhancement of the embodiment for the selective clamping circuit shown in FIG. 8A.

FIG. 8B shows a circuit diagram for an enhancement of the embodiment for the selective clamping circuit shown in FIG. 8A which utilizes the circuits as shown in FIG. 6B. Like references in FIGS. 8B and 6B refer to like or similar components, the description of which will not be repeated (see, description above).

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
   a memory array including a plurality of static random access memory (SRAM) cells arranged in a matrix with plural rows and plural columns, each row including a word line connected to the SRAM cells of the row, and each column including at least one bit line connected to the SRAM cells of the column;
   a word line driver circuit for each row having an output connected to drive the word line of the row;
   a row controller circuit configured to simultaneously actuate the plurality of word lines by applying pulses through the word line driver circuits to the word lines for an in-memory compute operation;
   a column processing circuit connected to the at least one bit line for each column and configured to process an analog voltage developed on the bit lines in response to the simultaneous actuation of the plurality of word lines to generate a decision output for the in-memory compute operation; and
   a bit line clamping circuit comprising a sensing circuit configured to compare the analog voltage on a given bit line to a threshold voltage and a voltage clamp circuit that is actuated in response to the comparison to preclude the analog voltage on that given bit line from decreasing below a clamping voltage level.

2. The circuit of claim 1, wherein the voltage clamp circuit comprises:
   a transistor having a source-drain path coupled between a supply voltage node and the given bit line;
   wherein a gate terminal of the transistor is configured to receive a clamp actuate signal that is asserted by the sensing circuit in response to the comparison.

3. The circuit of claim 1, wherein the sensing circuit generates a clamp actuate signal, and further comprising a flag signal generated in response to the clamp actuate signal, wherein the flag signal is indicative of a loss of sensitivity of the decision output for the in-memory compute operation.

4. The circuit of claim 1, wherein the voltage clamp circuit comprises:
   a first transistor having a source-drain path coupled between a supply voltage node and the given bit line;
   a second transistor having a source-drain path coupled in series with the source-drain path of the first transistor;
   wherein a gate terminal of the first transistor is configured to receive a clamp actuate signal that is asserted by the sensing circuit in response to the comparison; and
   wherein a gate terminal of the second transistor is configured to receive a control signal.

5. The circuit of claim 4, further comprising a flag signal generated in response to the clamp actuate signal, wherein the flag signal is indicative of a loss of sensitivity of the decision output for the in-memory compute operation.

6. The circuit of claim 1, wherein the sensing circuit comprises a Schmitt trigger circuit.

7. The circuit of claim 1, wherein the bit line clamping circuit further comprises a logic circuit configured to logically combine an output of the sensing circuit with a clamping circuit enable signal, wherein said logic circuit is configured, when said clamping circuit enable signal is deasserted, to block actuation of the voltage clamp circuit.

8. The circuit of claim 1, wherein said given bit line is one of a pair of bit lines for the SRAM cell.

9. The circuit of claim 1, wherein the bit line clamping circuit is a component of a bit line precharge circuit.

10. A circuit, comprising:
    a memory array including a plurality of static random access memory (SRAM) cells arranged in a matrix with plural rows and plural columns, each row including a word line connected to the SRAM cells of the row, and each column including at least one bit line connected to the SRAM cells of the column;
    a word line driver circuit for each row having an output connected to drive the word line of the row;
    a row controller circuit configured to simultaneously actuate the plurality of word lines by applying pulses through the word line driver circuits to the word lines for an in-memory compute operation;
    a column processing circuit connected to the at least one bit line for each column and configured to process an analog voltage developed on the bit lines in response to the simultaneous actuation of the plurality of word lines to generate a decision output for the in-memory compute operation; and
    a bit line clamping circuit comprising a sensing circuit configured to compare the analog voltage on a given bit line to a threshold voltage and a voltage clamp circuit that is actuated in response to the comparison to preclude the analog voltage on that given bit line from decreasing below a clamping voltage level;
    wherein the voltage clamp circuit comprises:
      a first transistor having a source-drain path coupled between a supply voltage node and the given bit line;
      a second transistor having a source-drain path coupled in series with the source-drain path of the first transistor;
      wherein a gate terminal of the first transistor is configured to receive a clamp actuate signal that is asserted by the sensing circuit in response to the comparison;
      wherein a gate terminal of the second transistor is configured to receive a control signal; and
      wherein the control signal is an analog bias voltage, and a voltage level of the analog bias voltage is configured to control a strength of the clamping circuit in clamping the bit line to the clamping voltage level.

11. The circuit of claim 10, further comprising:
    a voltage generating circuit configured to generate the analog bias voltage in response to a setting signal; and a control circuit configured to generate the setting signal for application to the voltage generator circuit.

12. The circuit of claim 11, wherein the setting signal is configured to cause modulation of the analog bias voltage away from a nominal level in response to an applicable integrated circuit process corner for transistor devices of the SRAM cells.

13. The circuit of claim 11, wherein the applicable integrated circuit process corner is indicated by a programmed code stored in the control circuit, and wherein the control circuit includes a lookup table (LUT) correlating the programmed code to a value of the setting signal.

14. The circuit of claim 11, wherein the control circuit further comprises a temperature sensor, and wherein the setting signal is configured to cause a temperature dependent tuning of the analog bias voltage in response to applicable integrated circuit process corner.

15. The circuit of claim 14, wherein the control circuit includes a lookup table (LUT) correlating sensed integrated circuit temperature to a tuning level for the value of the setting signal.

16. The circuit of claim 11, wherein the control circuit further comprises a temperature sensor, and wherein the setting signal is configured to cause modulation of the analog bias voltage away from a nominal level in response to an integrated circuit temperature sensed by the temperature sensor.

17. The circuit of claim 16, wherein the control circuit includes a lookup table (LUT) correlating sensed integrated circuit temperature to a value of the setting signal.

18. A circuit, comprising:
a memory array including a plurality of static random access memory (SRAM) cells arranged in a matrix with plural rows and plural columns, each row including a word line connected to the SRAM cells of the row, and each column including at least one bit line connected to the SRAM cells of the column;
a word line driver circuit for each row having an output connected to drive the word line of the row;
a row controller circuit configured to simultaneously actuate the plurality of word lines by applying pulses through the word line driver circuits to the word lines for an in-memory compute operation;
a column processing circuit connected to the at least one bit line for each column and configured to process an analog voltage developed on the bit lines in response to the simultaneous actuation of the plurality of word lines to generate a decision output for the in-memory compute operation; and
a bit line clamping circuit comprising a sensing circuit configured to compare the analog voltage on a given bit line to a threshold voltage and a voltage clamp circuit that is actuated in response to the comparison to preclude the analog voltage on that given bit line from decreasing below a clamping voltage level;
wherein the voltage clamp circuit comprises:
a first transistor having a source-drain path coupled between a supply voltage node and the given bit line;
a second transistor having a source-drain path coupled in series with the source-drain path of the first transistor;
wherein a gate terminal of the first transistor is configured to receive a clamp actuate signal that is asserted by the sensing circuit in response to the comparison;
wherein a gate terminal of the second transistor is configured to receive a control signal; and
wherein the control signal is generated in response to a digital control signal, and a digital value of the digital control signal is configured to control a strength of the clamping circuit in clamping the bit line to the clamping voltage level.

19. The circuit of claim 18, further comprising a control circuit configured to generate the digital control signal.

20. The circuit of claim 19, wherein the digital control signal is configured to cause modulation of clamping circuit strength away from a nominal level in response to an applicable integrated circuit process corner for transistor devices of the SRAM cells.

21. The circuit of claim 20, wherein the applicable integrated circuit process corner is indicated by a programmed code stored in the control circuit, and wherein the control circuit includes a lookup table (LUT) correlating the programmed code to a value of the digital control signal.

22. The circuit of claim 20, wherein the control circuit further comprises a temperature sensor, and wherein the digital control signal is configured to cause a temperature dependent tuning of clamping circuit strength in response to applicable integrated circuit process corner.

23. The circuit of claim 22, wherein the control circuit includes a lookup table (LUT) correlating sensed integrated circuit temperature to a tuning level for the value of the digital control signal.

24. The circuit of claim 19, wherein the control circuit further comprises a temperature sensor, and wherein the digital control signal is configured to cause modulation of clamping circuit strength away from a nominal level in response to an integrated circuit temperature sensed by the temperature sensor.

25. The circuit of claim 24, wherein the control circuit includes a lookup table (LUT) correlating sensed integrated circuit temperature to a value of the digital control signal.

26. A circuit, comprising:
a memory array including a plurality of static random access memory (SRAM) cells arranged in a matrix with plural rows and plural columns, each row including a word line connected to the SRAM cells of the row, and each column including a pair of bit lines connected to the SRAM cells of the column;
a word line driver circuit for each row having an output connected to drive the word line of the row;
a row controller circuit configured to simultaneously actuate the plurality of word lines by applying pulses through the word line driver circuits to the word lines for an in-memory compute operation;
a column processing circuit connected to the pair of bit lines for each column and configured to process analog voltages developed on the pair of bit lines in response to the simultaneous actuation of the plurality of word lines to generate a decision output for the in-memory compute operation; and
a bit line clamping circuit comprising a sensing circuit configured assert a clamp actuate signal if the analog voltage on either bit line of a given pair of bit lines fall below a threshold voltage and a voltage clamp circuit that is actuated in response to assertion of the clamp actuate signal to clamp the analog voltages on that given pair of bit lines to a clamping voltage level.

27. The circuit of claim 26, wherein the voltage clamp circuit comprises:
a first transistor having a source-drain path coupled between a supply voltage node and a first bit line of said given pair of bit lines; and a second transistor having a source-drain path coupled between the supply voltage node and a second bit line of said given pair of bit lines;
wherein gate terminals of the first and second transistors are configured to receive said clamp actuate signal.

28. The circuit of claim 26, wherein the voltage clamp circuit comprises:
a first transistor having a source-drain path coupled between a supply voltage node and a first bit line of said given pair of bit lines;
a second transistor having a source-drain path coupled between the supply voltage node and a second bit line of said given pair of bit lines;
wherein gate terminals of the first and second transistors are configured to receive said clamp actuate signal;
a third transistor having a source-drain path coupled in series with the source-drain path of the first transistor; and
a fourth transistor having a source-drain path coupled in series with the source-drain path of the second transistor;
wherein gate terminals of the third and fourth transistors are configured to receive a control signal.

29. The circuit of claim 28, wherein the control signal is an analog bias voltage, and a voltage level of the analog bias voltage is configured to control a strength of the clamping circuit in clamping the bit line to the clamping voltage level.

30. The circuit of claim 29, further comprising:
a voltage generating circuit configured to generate the analog bias voltage in response to a setting signal; and
a control circuit configured to generate the setting signal for application to the voltage generator circuit.

31. The circuit of claim 30, wherein the setting signal is configured to cause modulation of the analog bias voltage away from a nominal level in response to an applicable integrated circuit process corner for transistor devices of the SRAM cells.

32. The circuit of claim 31, wherein the applicable integrated circuit process corner is indicated by a programmed code stored in the control circuit, and wherein the control circuit includes a lookup table (LUT) correlating the programmed code to a value of the setting signal.

33. The circuit of claim 31, wherein the control circuit further comprises a temperature sensor, and wherein the setting signal is configured to cause a temperature dependent tuning of the analog bias voltage in response to applicable integrated circuit process corner.

34. The circuit of claim 33, wherein the control circuit includes a lookup table (LUT) correlating sensed integrated circuit temperature to a tuning level for the value of the setting signal.

35. The circuit of claim 30, wherein the control circuit further comprises a temperature sensor, and wherein the setting signal is configured to cause modulation of the analog bias voltage away from a nominal level in response to an integrated circuit temperature sensed by the temperature sensor.

36. The circuit of claim 35, wherein the control circuit includes a lookup table (LUT) correlating sensed integrated circuit temperature to a value of the setting signal.

37. The circuit of claim 26, wherein the sensing circuit comprises a Schmitt trigger circuit.

38. The circuit of claim 26, wherein the bit line clamping circuit further comprises a logic circuit configured to logically combine an output of the sensing circuit with a clamping circuit enable signal, wherein said logic circuit is configured, when said clamping circuit enable signal is deasserted, to block actuation of the voltage clamp circuit.

39. The circuit of claim 26, wherein the bit line clamping circuit is a component of a bit line precharge circuit.

\* \* \* \* \*